June 11, 1968 G. R. MITCHELL 3,388,366

ELECTRONIC COMPONENT CONNECTOR

Filed Jan. 21, 1966

INVENTOR.
GLENN R. MITCHELL

BY Wm. H. Dean

United States Patent Office 3,388,366
Patented June 11, 1968

3,388,366

ELECTRONIC COMPONENT CONNECTOR

Glenn R. Mitchell, 1830 N. Country Club Drive, Mesa, Ariz. 85201

Filed Jan. 21, 1966, Ser. No. 522,096
11 Claims. (Cl. 339—17)

ABSTRACT OF THE DISCLOSURE

An electronic component connector having a collar provided with a bore open from end to end and adapted to surround a group of conductors extending from an electronic component, and adapted to resiliently clamp said conductors about a projection of a base member which may be permanently coupled to a circuit board or other circuitry, said projection having contacts with which said collar is adapted to force said conductors of said component into firm engagement.

This invention relates to an electronic component connector, and more particularly, an electronic component connector adapted for use in connecting solid state electronic components to circuitry without the necessity of soldering the conductors of the components to connect them to such circuitry.

In the initial assembly, maintenance or repair of various electronic circuits, solid state devices, such as transistors and diodes, are usually coupled to the circuitry by soldering the conductors thereof to terminals, or the like. This practice requires precise soldering techniques, such as to prevent overheating the solid state electronics device, while soldering the conductors thereof.

Accordingly, it is an object of the present invention to provide an electronics component connector which may be used initially to assemble an electronics circuit means, wherein solid state electronics devices may be coupled to the circuit without soldering the conductors thereof to terminals, whereby time and labor is saved and, further, such solderless connections avoid the danger of overheating the solid state devices when coupling them to circuitry components.

Another object of the invention is to provide an electronics component connector of a very simple construction which saves time and labor in servicing circuits.

Another object of the invention is to provide an electronic component connector which permits machine dip soldering of circuit boards without the solid state components in connection therewith and thus, saves labor in the initial production of electronic circuits due to the fact that dip soldering of circuit boards may be accomplished without hand labor and without the danger of overheating solid state electronic components on the circuit boards.

Another object of the invention is to provide an electronics component connector structure which will not readily deteriorate from wear and which may include a locking device to prevent accidental displacement of a solid state component from a circuit board; the locking device being capable of withstanding considerable accelerative or shock force loading and/or vibration.

Another object of the invention is to provide an electronic component connector which permits circuit connected solid state device, such as transistors or diodes to be tested due to the fact that the conductors of such devices may readily be made free for coupling to a testing device.

Another object of the invention is to provide an electronic component connector which is adapted to hold the conventional conductors of transistors, diodes or other electronic components very securely in connection with contacts which are soldered to conductors on a circuit board or the like.

Another object of the invention is to provide an electronic component connector having a base element provided with an outwardly projecting male portion on which circuit connected contacts are disposed; said male portion being surrounded by a collar which is also adapted to surround the conductors of an electronic component and to hold and force the connectors of the electronic component into firm contact with the contact portions of the male projection of a device; said collar being slightly resilient to thereby maintain a preload of the conductors of the electronics component with the contacts of the male projection of the device.

Further objects and advantages of the present invention may be apparent from the following specification, appended claims and accompanying drawings, in which:

Figure 1:
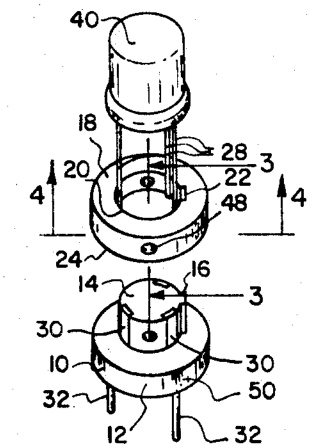
FIG. 1 is an exploded perspective view of an electronics component connector of the present invention showing a conventional transistor relative thereto, whereby the connectors of the transistor may be engaged by the connector and coupled to an electronics circuit.

As shown in FIG. 1 of the drawings, the electronic component connector of the invention comprises a base 10 which may be made of plastic or any other suitable dielectric material. This base 10 is provided with a frame or circuit board engaging disc portion 12 having an integral or separate projecting male portion 14. This portion 14 is preferably circular in cross-section, but may be a letter in cross-sectional configuration, as desired.

The projection 14 is provided with an axially directed integral key portion 16 to provide rotational orientation of a collar 18 of the invention which is provided with a bore 20 adapted to be fitted over the male projection 14. This bore 20 is provided with a slotted key way 22 adapted to receive the key portions 16 or the male projection 14 and to thereby rotationally orient the collar 18 with respect to the base 10.

As shown in FIG. 1, a conventional transistor 40, for example, is provided with conventional conductors 28 and the bore 20 is sufficiently large to be placed in surrounding relation to the conductors without substantially deforming these conductors. It will be seen that the bore is sufficiently large from end to end to receive the conductors as aforementioned.

Figure 2:
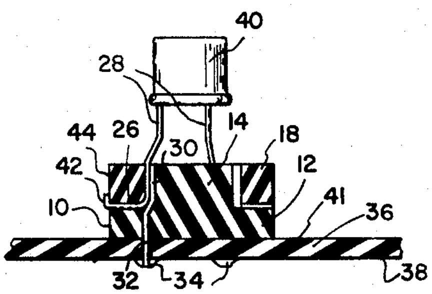
FIG. 2 is a vertical sectional view taken through the component connector of the invention and showing the connector holding the conductors on a transistor in connection with a circuit board.
Figure 3:
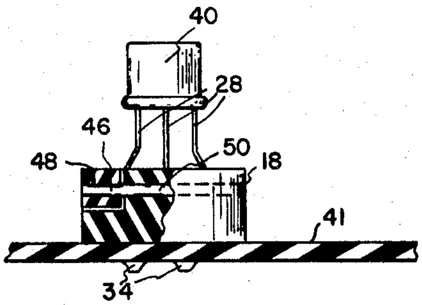
FIG. 3 is a view similar to FIG. 2, but taken on line 3—3 of FIG. 1, showing a locking pin extending through the base projection and the surrounding collar of the device of the invention.
Figure 4:
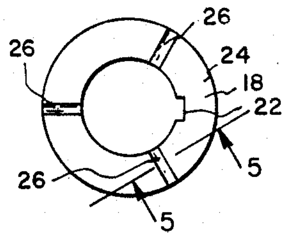
FIG. 4 is an enlarged bottom plan view taken from the line 4—4 of FIG. 1, showing the collar of the component connection device of the invention.
Figure 5:
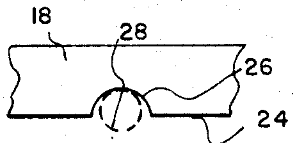
FIG. 5 is an enlarged fragmentary sectional view taken from the line 5—5 of FIG. 4.

The lower end 24 of the collar 18 is provided with a plurality of notches 26, also shown in FIG. 5 of the drawings. These notches 26 are disposed to receive conductors 28 of a transistor, or the like, and these notches 26 are by means of the key 18 and key way 22, aligned with respective contacts 30 on the disc 12, these contacts 30 are connected to conductors 32 which, as shown in FIG. 2 of the drawings, are soldered to terminals 34 on a circuit board 36. The conductors 32 extending through openings in the circuit board 36, which has a printed circuit side 38 and an opposite side 41 on which the disc shaped portion 12 of the base 10 is engaged. It will be seen that the conductors 28 of the transistor 40 are bent radially through the notches 26 and bent upwardly at their outer ends 42 about the perimeter 44 of the collar 18. The notches 26 align the portions of the conductors 28 in the notches 26 with the contacts 30, so that when the collar 18 is pressed downwardly against the disc-shaped portion 12 the conductors 28 make firm contact with the contacts 30. The conductors 28 are held firmly in connection with the contacts 30, by means of a pin 46, shown in FIG. 3 of the drawings; this pin being inserted through openings 48 and 50, respectively, in the collar 18 and the male projection 14. Thus, when the pin 46 is in position, the collar 18 is held contiguous to the disc-shaped portion 12 of the base 10 and inasmuch as the portions of the conductors 28 are bent or folded through the notches 26, they tend to be sprung into a substantially curved condition and when held in position by the pin 46, they are sprung tight against the contacts 30.

It will be apparent to those skilled in the art that the transistor 40, or any other electronics component including a diode or a circuit subassembly, may readily be removed from the basic circuit board 36 and related circuit components by removing the pin 46 and the collar 18, thus, permitting replacement of the component 40 or testing thereof by coupling the conductors 28 to a conventional testing device. Further, it will be appreciated that this simple means firmly locks a circuit component onto a circuit board or other structure holding circuit elements and, further, it will be seen that the base structure of the component connector of the invention may be initially installed on the circuit board 36 without the component 40 and thus dip soldering may be done wtihout any critical heating problem with respect to solid state circuit components or other components which may have a critical heat range. Thus, after all of the soldering is completed upon initial production, the critical circuit component 40 may be connected to the circuit board, or other structure, by means of the collar 18 in each instance being positioned over the projection 14 of the respective base 10 of the invention.

Figure 6:
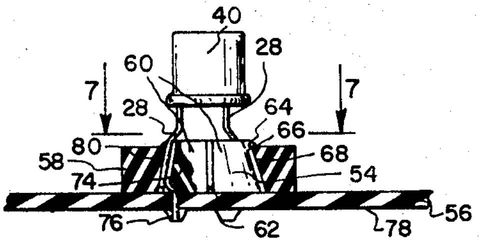
FIG. 6 is a sectional view similar to FIG. 2, but showing a modification of the invention.
Figure 7:
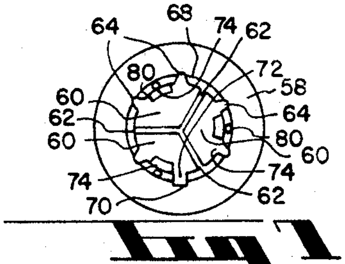
FIG. 7 is a top or plan view of the modified structure shown in FIG. 6 and taken from line 7—7 of FIG. 6.

In the modification of the invention as shown in FIGS. 6 and 7, a frusto conical base 54, similar to the male projection 14, may be secured to a circuit board 56 preliminary to the placement of a collar 58 in surrounding relation with the base 54.

The base 54 being a frusto conical base is provided with three upwardly directed segments 60, separated at their upper ends by slots 62, which may permit slight resilient deflection of the portion 60 inward toward each other during the placement of the collar 58 thereover. Upper end portions of the segments 60 are provided with outward cam-shaped radially extending projections 64 which are adapted to overlie an upper edge portion 66 of the respective collar 58 at its respective bore portion 68.

The bore portion 68 is provided with a key way 70 adapted to receive an orientation key structure 72 of one of the portions 60. Each portion 60 is provided with a contact 74 in its outer portion, whereby the contacts 74 are on the outer periphery of the upwardly extending frusto conical projection 54. This projection 54 may be disposed upside down from that as shown in FIG. 6 or horizontally, if desired, depending upon the nature of the installation.

The contacts 74 are provided with conductor portions 76 soldered to a printed circuit structure on one side 78 of the board 56.

It will be seen that the circuit component 40, such as a transistor or diode, may have its conductors 28 engaged with the contacts 74 on the base 54 and the collar 58 may be pressed down over the projecting portions 64 of the base, such as to cause inward deflection of the portion 60 of the base, until the end of the collar 58 has passed the portion 64 at which time they spring outward beyond the diameter of the bore 68 and engage the end 66 of the collar 58 slightly beyond the confines of the bore 68, thus, the collar is held in substantially compressive engagement with the projection 54 and portions 80 of the conductors 28 are compressively engaged with the respective contacts 74 carried by the base 54.

It will be apparent to those skilled in the art that the collar and the base structures of the invention, forming the electronic component connector thereof, may be made of resilient plastic or any other suitable dielectric material and that the collar placed in surrounding relation with a projection compressively holds conductor portions of a transistor, diode or other electronics component in firm electrical connection with contacts of the male projection of the base of the invention, such as to provide readily removable means for holding a transistor or diode, for example, in coupled relation with other circuit components. This arrangement provides for simplicity in the servicing of electronic circuits and the replacement of components therein.

It will be obvious to those skilled in the art that various modifications of the present invention may be resorted to in a manner limited only by a just interpretation of the following claims.

I claim:

1. In a component connector, the combination of: a base member having a male connector projection means; a collar having a bore removably surrounding said projection means; contacts carried on said male projection means of said base member; and conductors of a component disposed and clamped between said projection means and said bore of said collar said bore being open from end to end and said bore being of a diameter from end to end, such that said bore may surround a group of said conductors without necessity of substantially deforming the conductors to insert the collar over the conductors.

2. The invention, as defined in claim 1, wherein: interengaging means of said projection means and said collar, for effecting rotational orientation of said collar on said base member; and means for locating said conductors on said collar in alignment with said contacts.

3. The invention, as defined in claim 2, wherein: a circuitry supporting plate on which said base member is mounted and second conductors extending from said contacts and adapted to be fixed to circuitry on said plate.

4. The invention, as defined in claim 1, wherein: locking means for locking said collar on said projection means to prevent accidental displacement thereof therefrom.

5. The invention, as defined in claim 4, wherein: said locking means comprising a pin projecting through a portion of said collar and said projection means.

6. In a component connector, the combination of: a base member having a male connector projection means; a collar having a bore removably surrounding said projection means; contacts carried on said base member; and conductors of a component disposed and clamped between said projection means and said collar said bore being open from end to end and of a diameter such that said bore may be placed in surrounding relation to a group of conductors extending from a transistor or like component without necessity of deforming its conductors.

7. The invention, as defined in claim 6, wherein: means interengaging said projection means and said collar for effecting rotational orientation of said collar on said base member; and means for locating said conductors on said collar in alignment with said contacts.

8. The invention, as defined in claim 7, wherein: a circuitry supporting plate on which said base member is mounted and second conductors extending from said contacts and adapted to be fixed to circuitry on said plate.

9. The invention, as defined in claim 6, wherein: locking means for locking said collar on said projection means to prevent accidental displacement thereof therefrom.

10. The invention, as defined in claim 6, wherein: said locking means comprising a deflectable portion extending radially from said projecting means and disposed thereon to engage an end of said collar outwardly relative to said bore for holding said collar against axial displacement from said projection means.

11. The invention, as defined in claim 10, wherein: said projecting means axially slotted and comprising a plurality of radially deflectable sections, one of said sections carrying said deflectable portion.

References Cited

UNITED STATES PATENTS

| | | | |
|---|---|---|---|
| 1,551,876 | 9/1925 | Hartmann | 339—209 X |
| 2,475,243 | 7/1949 | Irrgang | 339—196 X |
| 2,749,526 | 6/1956 | Petersen | 339—65 X |
| 2,851,670 | 9/1958 | Senior | 339—75 |
| 3,149,266 | 9/1964 | Lipton | 174—68.5 X |
| 3,184,532 | 5/1965 | Spera | 339—17 XR |
| 3,263,200 | 7/1966 | Kocmich | 339—17 |

FOREIGN PATENTS

| | | |
|---|---|---|
| 27,992 | 1896 | Great Britain. |

MARVIN A. CHAMPION, *Primary Examiner.*

PATRICK A. CLIFFORD, *Examiner.*